United States Patent [19]
Besser et al.

[11] Patent Number: 6,165,903
[45] Date of Patent: Dec. 26, 2000

[54] METHOD OF FORMING ULTRA-SHALLOW JUNCTIONS IN A SEMICONDUCTOR WAFER WITH DEPOSITED SILICON LAYER TO REDUCE SILICON CONSUMPTION DURING SALICIDATION

[75] Inventors: Paul R. Besser, Sunnyvale; Nick Kepler, Saratoga, both of Calif.; Karsten Wieczorek, Reichenberg-Boxdorf, Germany

[73] Assignee: Advanced Micro Devices, Inc., Sunnyvale, Calif.

[21] Appl. No.: 09/185,516

[22] Filed: Nov. 4, 1998

[51] Int. Cl.[7] .................................................. H01L 21/44
[52] U.S. Cl. ........................ 438/682; 438/301; 438/303; 438/683; 438/655; 438/664; 438/649; 438/592
[58] Field of Search .................................... 438/682, 683, 438/664, 655, 649, 651, 648, 592, 581, 300, 301, 303–307

[56] References Cited

U.S. PATENT DOCUMENTS

| | | | |
|---|---|---|---|
| 5,972,785 | 10/1999 | Shishiguchi et al. | 438/592 |
| 5,994,191 | 11/1999 | Xiang et al. | 438/300 |
| 6,015,752 | 1/2000 | Xiang et al. | 257/655 |

FOREIGN PATENT DOCUMENTS 0 651 076 A1  10/1994  European Pat. Off. .

OTHER PUBLICATIONS

H. Jiang et al., "Ultra Shallow Junction Formation Using Diffusion From Silicides", J. Electrochem, Soc., vol. 139, No. 1, Jan. 1992, pp. 196–218.

Materials and Bulk Processes, "Doping Technologies", The National Technology Roadmap for Semiconductors, 1994, pp. 118–121.

*Primary Examiner*—Charles Bowers
*Assistant Examiner*—Thanh Nguyen

[57] ABSTRACT

A method for forming ultra shallow junctions in a semiconductor wafer with reduced silicon consumption during salicidation supplies additional silicon during the salicidation process. After the gate and source/drain junctions are formed in a semiconductor device, high resistivity metal silicide regions are formed on the gate and source/drain junctions. Silicon is then deposited in a layer on the high resistivity metal silicide regions. An annealing step is then performed to form low resistivity metal silicide regions on the gate and source/drain junctions. The deposited silicon is a source of silicon that is employed as a diffusion species during the transformation of the high resistivity metal silicide (such as CoSi) to a low resistivity metal silicide (such as $CoSi_2$). Since the additional silicon provided in the deposited layer is consumed, there is reduced consumption of the silicon from the ultra-shallow junctions, thereby preventing the bottom of the silicide regions from reaching the bottom of the source/drain junctions.

18 Claims, 4 Drawing Sheets

METHOD OF FORMING ULTRA-SHALLOW JUNCTIONS IN A SEMICONDUCTOR WAFER WITH DEPOSITED SILICON LAYER TO REDUCE SILICON CONSUMPTION DURING SALICIDATION

FIELD OF THE INVENTION

The present invention relates to the field of semiconductor device manufacturing, and more particularly, to the formation of low resistivity self-aligned silicide regions on the gate and source/drain junctions.

BACKGROUND OF THE INVENTION

In the manufacture of integrated circuits, a commonly used practice is to form silicide on source/drain regions and on polysilicon gates. This practice has become increasingly important for very high density devices where the feature size is reduced to a fraction of a micrometer. Silicide provides good ohmic contact, reduces the sheet resistivity of source/drain regions and polysilicon gates, increases the effective contact area, and provides an etch stop.

A common technique employed in the semiconductor manufacturing industry is self-aligned silicide ("salicide") processing. Salicide processing involves the deposition of a metal that forms intermetallic with silicon (Si), but does not react with silicon oxide or silicon nitride. Common metals employed in salicide processing are titanium (Ti), cobalt (Co), and nickel (Ni). These common metals form low resistivity phases with silicon, such as $TiSi_2$, $CoSi_2$, and NiSi. The metal is deposited with a uniform thickness across the entire semiconductor wafer. This is accomplished using, for example, physical vapor deposition (PVD) from an ultra-pure sputtering target and a commercially available ultra-high vacuum (UHV), multi-chamber, DC magnetron sputtering system. Deposition is performed after both the polysilicon gate and the source/drain junction formation. After deposition, the metal blankets the polysilicon gate electrode, the oxide spacers, the oxide isolation, and the exposed source and drain electrodes. A cross-section of an exemplary semiconductor wafer during one stage of a salicide formation process in accordance with the prior art techniques is depicted in FIG. 1.

As shown in FIG. 1, a silicon substrate 10 has been provided with the source/drain junctions 12, 14 and a polysilicon gate 16. Oxide spacers 18 have been formed on the sides of the polysilicon gate 16. The refractory metal layer 20, comprising cobalt, for example, has been blanket deposited over the source/drain junctions 12, 14, the polysilicon gate 16 and the spacers 18. The metal layer 20 also blankets oxide isolation regions 22 that isolate the devices from one another.

A first rapid thermal anneal (RTA) step is then performed at a temperature of between about 450°–700° C. for a short period of time in a nitrogen atmosphere. The nitrogen reacts with the metal to form a metal nitride at the surface of the metal, while the metal reacts with silicon and forms silicide in those regions where it comes in direct contact with the silicon. Hence, the reaction of the metal with the silicon forms a silicide 24 on the gate 16 and source/drain regions 12, 14, as depicted in FIG. 2.

After the first rapid thermal anneal step, any metal that is unreacted is stripped away using a wet etch process that is selective to the silicide. A second, higher temperature rapid thermal anneal step, for example above 700° C., is applied to form a lower resistance silicide phase of the metal silicide. The resultant structure is depicted in FIG. 3 in which the higher resistivity metal silicide 24 has been transformed to the lowest resistivity phase metal silicide 26. For example, when the metal is cobalt, the higher resistivity phase is CoSi and the lowest resistivity phase is $CoSi_2$. When the polysilicon and diffusion patterns are both exposed to the metal, the silicide forms simultaneously over both regions so that this method is described as "salicide" since the silicides formed over the polysilicon and single-crystal silicon are self-aligned to each other.

Titanium is currently the most prevalent metal used in the integrated circuit industry, largely because titanium is already employed in other areas of 0.5 micron CMOS logic technologies. In the first rapid thermal anneal step, the so-called "C49" crystallographic titanium phase is formed, and the lower resistance "C54" phase forms during the second rapid thermal anneal step. However, the titanium silicide sheet resistance rises dramatically due to narrow-line effects. This is described in European Publication No. 0651076. Cobalt silicide ($CoSi_2$) has been introduced by several integrated circuit manufacturers as the replacement for titanium silicide. Since cobalt silicide forms by a diffusion reaction, it does not display the narrow-line effects observed with titanium silicide that forms by nucleation-and-growth. Some of the other advantages of cobalt over alternative materials such as platinum or palladium are that cobalt silicide provides low resistivity, allows lower-temperature processing, and has a reduced tendency for forming diode-like interfaces.

In both titanium and cobalt silicide technologies, the silicon is consumed by the reaction to form the silicide. As the industry moves to shallower junctions to increase the switching speed of the semiconductor devices, overly large silicon consumption results in insufficient distance between the bottom of the silicide and the bottom of the source/drain junctions, and therefore results in junction leakage. An example of this problem is depicted in prior art FIG. 3. The cobalt silicide regions 26 are depicted as extending to the bottom of the source/drain junctions 12, 14 so as to create junction leakage.

The consumption of the silicon depends on theoretical density ratios. The consumption ratio of the common silicide metals has been calculated by Muraraka and described in *Silicides for VLSI Applications*, 1983, S. P. Muraraka. The consumption ratio is the ratio of silicon consumed to the silicide thickness. A low consumption ratio is desirable in order to reduce the silicon consumption. Titanium consumes 0.9, cobalt consumes 1.03 and nickel consumes 0.78. Although nickel would appear to the best choice for low consumption ratio, other limitations prevent its use in current semiconductor processor manufacturing.

SUMMARY OF THE INVENTION

There is a need for a method of producing ultra-shallow junctions and employing salicide technology without excessive silicon consumption so as to prevent junction leakage.

This and other needs are met by embodiments of the present invention which provides a method of forming ultra-shallow junctions in a semiconductor wafer with reduced silicon consumption during silicidation. In this method, the gate and the source/drain junctions are first formed. High resistivity metal silicide regions are then formed on the gate and source/drain junctions. Next, silicon is deposited on the high resistivity metal silicide regions. Once the silicon has been deposited, an annealing step is performed to form low resistivity metal silicide regions on the gate and source/drain junctions. At least some of the deposited silicon is consumed during the annealing.

By depositing silicon on the high resistivity metal silicide regions and then annealing to form the low resistivity metal silicide regions, a source of silicon other than that contained in the gate and source/drain junctions is provided. Since the transformation of the silicide regions from the high resistivity phase to a lower resistivity phase is a diffusional process in which silicon is the diffusing species, the supplying of silicon on the metal silicide regions is what prevents the excessive consumption of the silicon from the source/drain junctions and the gate. The present invention thereby provides sufficient distance between the bottom of the silicide and the bottom of the source/drain junction so that there will be no junction leakage.

The earlier stated needs are also met by another embodiment of the present invention which provides a method of reducing consumption of silicon in source/drain junctions during silicidation. This method comprises the steps of forming high resistivity metal silicide regions on source/drain junctions and depositing silicon on a high resistivity metal silicide region. The high resistivity metal silicide regions are transformed into low resistivity metal silicide regions by consuming at least some of the deposited silicon.

In still further embodiments of the present invention, the earlier stated needs are met by an article which comprises a semiconductor device having a gate and source/drain junctions. Low resistivity metal silicide regions are provided on the gate and source/drain junctions. The article has unreacted silicon regions between the gate and the source/drain junctions. In certain embodiments, the low resistivity metal silicide regions include silicon from the source/drain junctions, metal from a metal layer, and consumed silicon from a deposited silicon layer.

The article according to the present invention may be an intermediate article formed during the manufacture of a semiconductor device. The unreacted silicon regions between the gate and the source/drain junctions, and other unreacted silicon regions, may be stripped from the wafer surface to prevent bridging across isolation spacers, if bridging is a concern. Otherwise, the unreacted silicon may be left in place in the final article.

Additional features and advantages of the present invention will become readily apparent to those skilled in the art from the following detailed description, when embodiments of the invention are described, simply by way of illustration of the best mode contemplated for carrying out the invention. As will be realized, the invention is capable of other and different embodiments and its several details are capable of modifications and various obvious respects, all without departing from the invention. Accordingly, the drawings and description are to be regarded as illustrative in nature, and not as restrictive.

DETAILED DESCRIPTION OF THE INVENTION

The present invention allows ultra-shallow junction formation by reducing the amount of silicon consumption during salicidation. The invention achieves this in certain embodiments by providing silicon in a blanket deposited layer over high resistivity metal silicide regions. The silicon in the deposited layer acts as a source of silicon for diffusion during the reaction in the transformation of the high resistivity metal silicide regions to lower resistivity metal silicide regions. The reduction in silicon consumption in the source/drain junctions allows these junctions to be made shallower and avoid junction leakage concerns.

Figure 1:
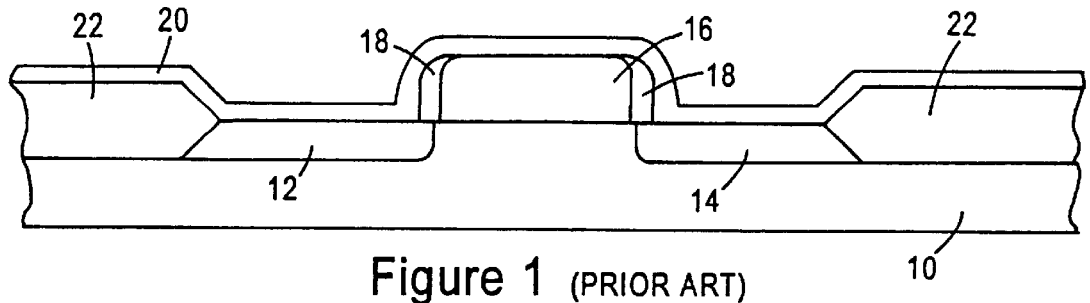
FIG. 1 is a cross-section of a portion of a semiconductor wafer processed in accordance with the prior art during one step of a salicide process.
Figure 2:
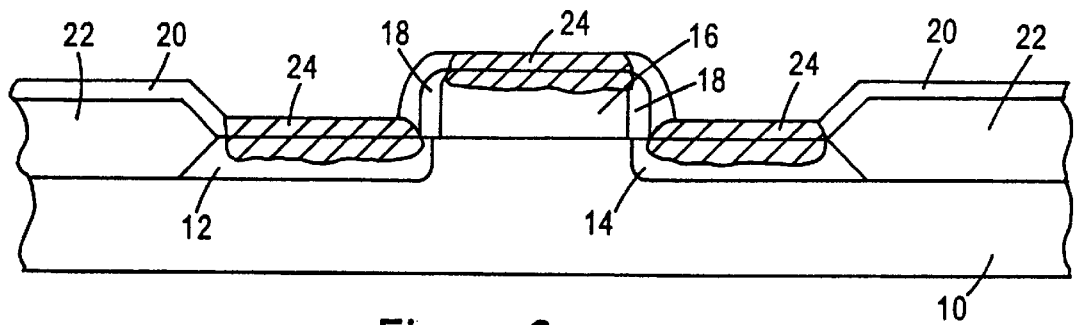
FIG. 2 depicts the cross-section of FIG. 1 after a first rapid thermal anneal step to form a high resistivity metal silicide region in accordance with the prior art.
Figure 3:
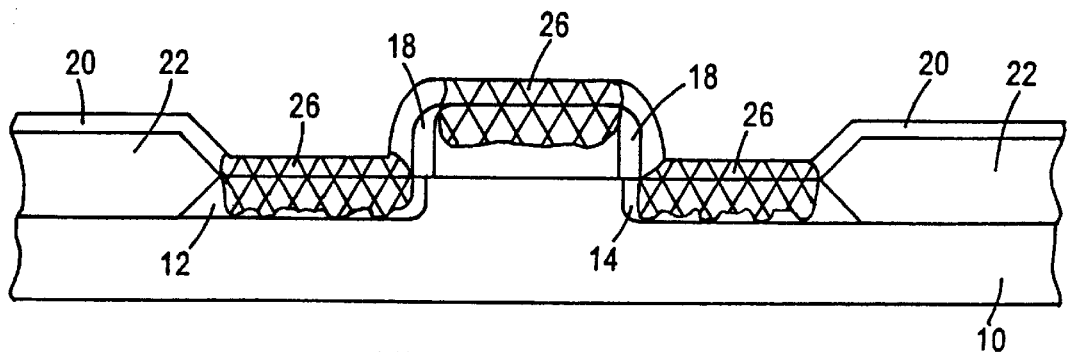
FIG. 3 is a cross-section of the semiconductor wafer of FIG. 2 following a second rapid thermal annealing step to form lower resistivity metal silicide regions in accordance with the prior art.
Figure 4:
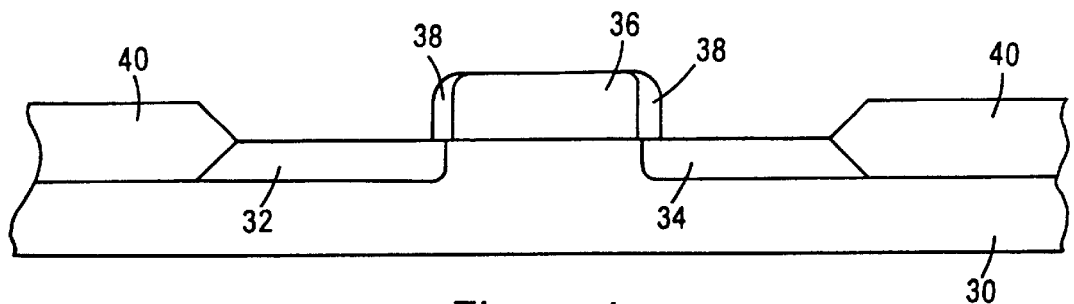
FIG. 4 is a cross-section of a portion of a semiconductor wafer prior to a salicidation process in accordance with certain embodiments of the present invention.

FIG. 4 is a cross-section of a semiconductor device on a semiconductor wafer on which low resistivity metal silicide regions will be formed in accordance with embodiments of the present invention. As with conventional semiconductor devices, a source junction 32 and a drain junction 34 are formed within a silicon substrate 30. A gate etch has produced a gate 36. Oxide (or nitride) spacers 38 are provided on the sides of the polysilicon gate electrode 36. Oxide isolation (such as LOCOS) regions 40 isolate individual semiconductor devices from each other.

A layer of refractory metal 42 is then deposited uniformly across the entire wafer, preferably using physical vapor deposition from an ultra-pure sputtering target and a commercially available ultra-high-vacuum, multi-chamber, DC magnetron sputtering system. In certain preferred embodiments, the metal is cobalt (Co). Cobalt has a number of advantages over other types of metals. For example, in comparison to silicon, titanium silicide sheet resistance rises dramatically due to narrow-line effects. Since the low resistivity phase of cobalt silicide forms by a diffusion reaction rather than nucleation-and-growth as in the low resistivity phase of titanium silicide, cobalt silicide has been introduced by several integrated circuit manufacturers as the replacement for titanium. However, the use of cobalt in layer 42 as a refractory metal is exemplary only.

Figure 5:
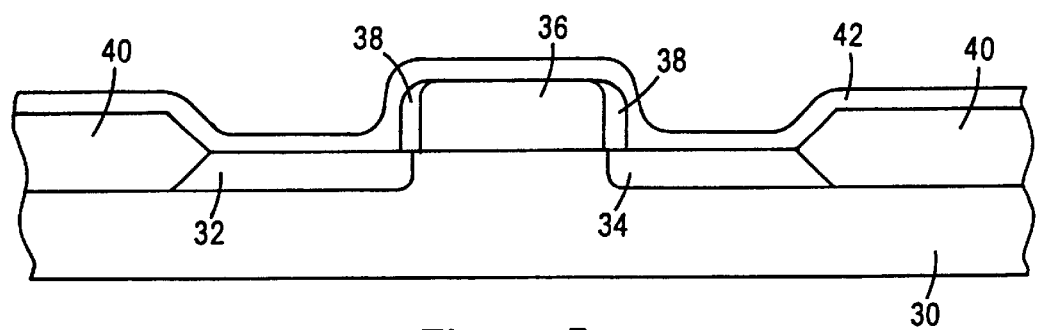
FIG. 5 is a depiction of the semiconductor device of FIG. 4, following the application of a metal layer, such as cobalt, in accordance with certain embodiments of the present invention.
Figure 6:
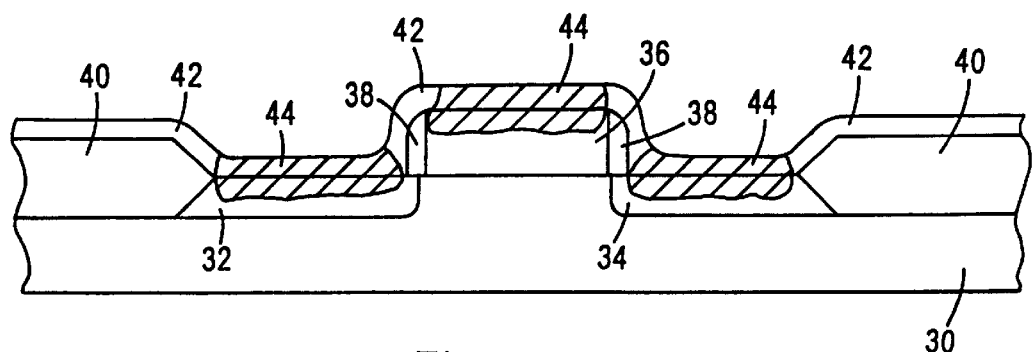
FIG. 6 depicts the semiconductor device of FIG. 5 following a first rapid thermal anneal step to form high resistivity metal silicide regions in accordance with embodiments of the present invention.

FIG. 6 depicts the semiconductor device of FIG. 5 after the formation of high resistivity metal silicide regions. In certain preferred embodiments, the high resistivity metal silicide regions 44 are created by a rapid thermal anneal step. The high resistivity metal silicide regions 44 may be made of cobalt silicide (CoSi), for example. The first rapid thermal annealing step may be performed by exposing, the semiconductor wafer to a temperature between about 450° C. and about 600° C., and most preferably 500° C. The semiconductor wafer will be exposed for a relatively short time, for example, between about 5 and 90 seconds. As is apparent from FIG. 6, some of the silicon in the source and drain junctions 32, 34 is consumed during the first rapid thermal annealing step to become part of the high resistivity metal silicide regions 44. This is true also for the silicon in the polysilicon gate 36. At this point, a second thermal annealing step performed immediately in accordance with the prior art could cause excessive silicon consumption and the silicide to reach the bottom of the source or drain junctions 32, 34, leading to junction leakage. As will be further described, the present invention avoids this concern by supplying silicon for consumption during the second rapid annealing step.

Figure 7:
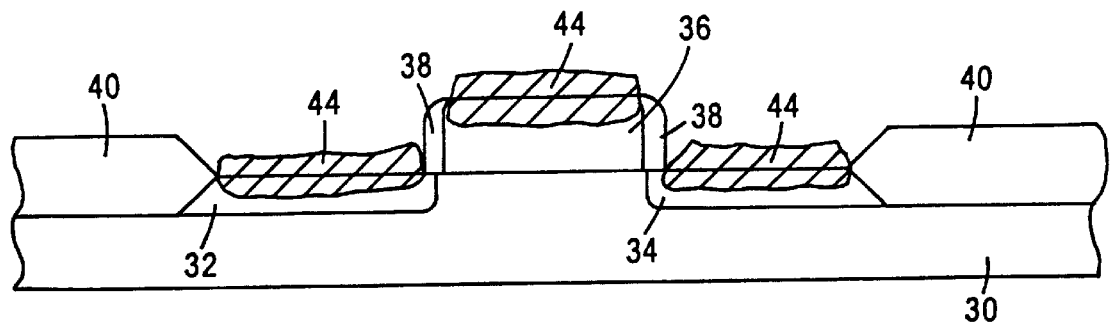
FIG. 7 depicts the semiconductor device of FIG. 6 following a selective etch that removes unreacted metal in accordance with embodiments of the present invention.

Prior to the supplying of additional silicon, a selective etch is performed to remove any unreacted refractory metal, such as cobalt. A typical etchant employed to remove unreacted cobalt is $3HCl:H_2O_2$. Removal of the unreacted metal by the peroxide solution leaves the silicide regions 44 intact. The resultant structure is depicted in FIG. 7.

Following the removal of any unreacted metal, the additional silicon is then provided by a blanket deposition of silicon over the areas of the semiconductor device. The silicon layer 46 that has been deposited therefore covers the oxide isolation 40, the spacers 38, and the high resistivity metal silicide (e.g. CoSi) regions 44. The silicon layer may be deposited to a thickness between about 50Å and 1000Å, and preferably to a thickness of about 300Å. Stated alternatively, although it can vary greatly, an exemplary ratio of the thickness of the deposited silicon to the thickness of the high resistivity metal silicide regions 44 is about 1.5:1. This relatively thin silicon layer 46 may be deposited using physical vapor deposition sputtering methods or with low temperature chemical vapor deposition methods, with the preferred embodiment employing physical vapor deposition sputtering methods.

The silicon provided in the deposited silicon layer 46 supplies silicon for the transformation of the high resistivity metal silicide regions to low resistivity metal silicide regions. This transformation is a diffusion process, and silicon is the diffusing species during the reaction. By depositing silicon on the surface, less silicon will be consumed from the junction areas 32, 34 as the low resistivity metal silicide regions are formed.

Figure 8:
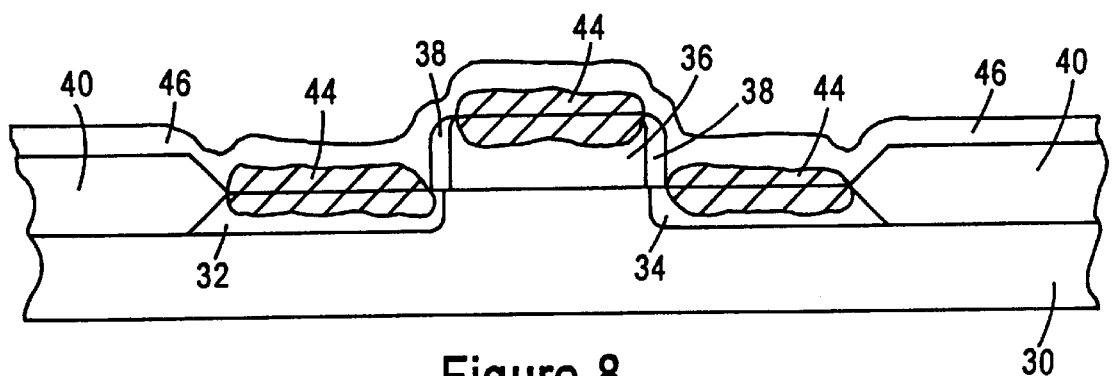
FIG. 8 is a depiction of the semiconductor device of FIG. 7 after blanket deposition of a silicon layer, in accordance of embodiments of the present invention.
Figure 9:
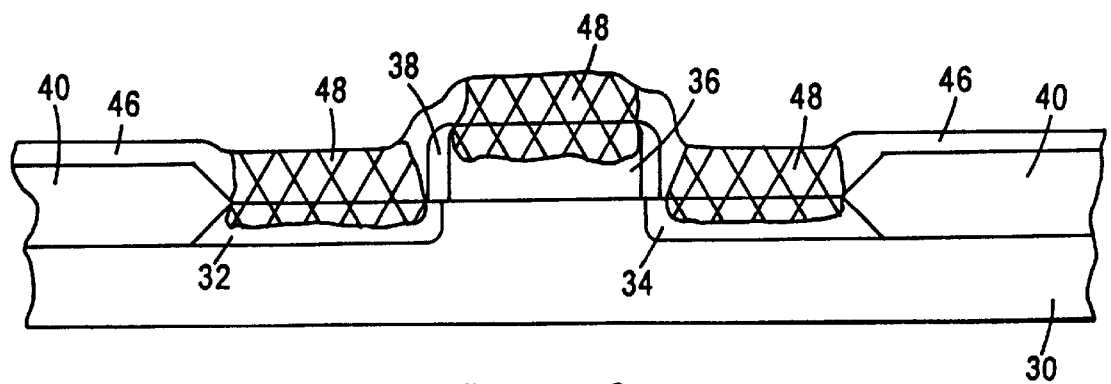
FIG. 9 is a depiction of the semiconductor device of FIG. 8 after a second rapid thermal annealing is performed to form lower resistivity metal silicide regions, in accordance with embodiments of the present invention.

Following the deposition of the silicon layer 46, as depicted in FIG. 8, a second rapid thermal anneal step is performed to produce lower resistivity metal silicide regions 48, as depicted in FIG. 9. This second rapid thermal anneal step exposes the semiconductor wafer to a higher temperature than employed in the first rapid thermal anneal step. A temperature in this second rapid thermal anneal step is between about 600° C. and 850° C., and preferably is 800° C. The semiconductor wafer is exposed to the high temperature for between about 5 and about 90 seconds.

As silicon is the diffusing species in the reaction, such as the transformation of the high resistivity phase of cobalt silicide (CoSi) to the low resistivity phase ($CoSi_2$), silicon from the silicon layer 46 is consumed. However, the silicon in the source/drain junction 32, 34 will not be excessively consumed since the silicon layer 46 supplies additional silicon for the monosilicide to disilicide transformation. The low resistivity metal silicide regions 48, as depicted in FIG. 9, do not reach the bottom of the source/drain junctions 32, 34. Hence, the junction leakage problem is avoided with the embodiments of the present invention.

Figure 10:
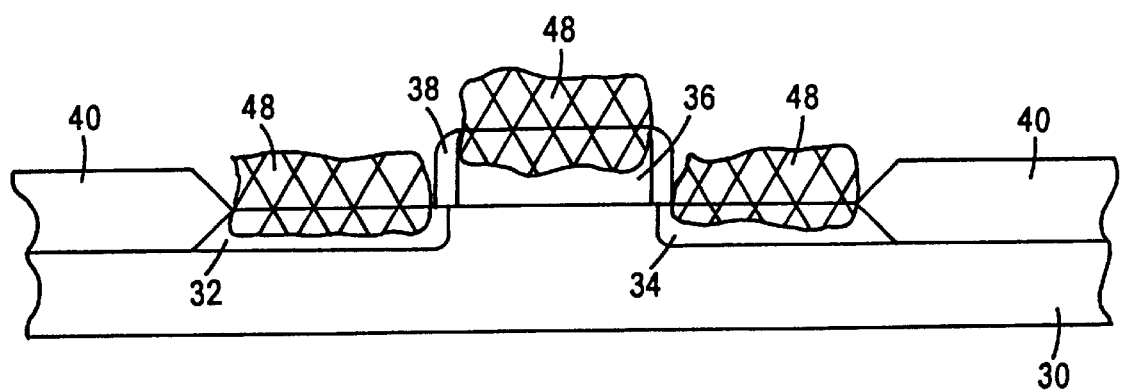
FIG. 10 depicts the semiconductor device of FIG. 9 following removal of unreacted silicon, in accordance with certain embodiments of the present invention.

In certain instances, the unreacted silicon in silicon layer 46 may be left in place. However, in certain cases, the unreacted silicon and silicon layer 46 will produce bridging across the spacer 40. In such cases, the unreacted silicon 46 needs to be stripped from the wafer surface to prevent the bridging across spacer 40. FIG. 10 depicts the semiconductor device of FIG. 9 after the unreacted silicon 46 has been stripped for these cases. The unreacted silicon is stripped by a selective etching process.

The embodiments of the present invention allow ultrashallow junctions to be formed and employed in a semiconductor device with a low resistivity metal silicide, such as cobalt ($CoSi_2$) while avoiding junction leakage due to excessive silicon consumption during the salicidation process. This permits faster devices and better performance of the semiconductor device. An exemplary embodiment has been described in which cobalt is employed as the refractory metal in forming the silicide. However, the present invention finds utility in other applications employing other materials in which a monosilicide is transferred to a disilicide, where silicon is the diffusing species.

Only certain preferred embodiments of the present invention are shown and but a few examples of its versatility are shown and described in the present disclosure. It is to be understood that the present invention is capable of using various other combinations and environments is capable of changes and modifications within the scope of the invention concept has expressed herein.

What is claimed is:

1. A method of forming ultra-shallow junctions in a semiconductor wafer with reduced silicon (Si) consumption during silicidation, comprising the steps of:

forming a gate and source/drain junctions having upper surfaces;

forming first metal silicide regions on the gate and source/drain junctions;

depositing Si on the first metal silicide regions; and annealing to form second metal silicide regions at a lower resistivity than said first metal silicide regions by diffusion reaction of a higher resistivity first metal silicide regions and Si on the gate and source/drain junctions, wherein at least some of the deposited Si is consumed during the annealing, and the second metal silicide regions extend below the upper surface of the gate and source/drain junctions.

2. The method of claim 1, wherein the Si is deposited to a thickness relative to the thickness of the first metal silicide regions such that the deposited Si is preferentially consumed in comparison to the source/drain junctions during the annealing to form the second metal silicide regions.

3. The method of claim 2, wherein the ratio of the thickness of the deposited Si to the thickness of the first metal silicide regions is about 1.5:1.

4. The method of claim 1, wherein the step of forming the first metal silicide regions includes the steps of:

depositing a metal on the gate and source/drain junctions; and annealing to form the first metal silicide regions on the gate and source/drain junctions.

5. The method of claim 4, wherein the step of annealing to form the first metal silicide regions includes exposing the gate and source/drain junctions to a temperature between about 450° C. and about 600° C.

6. The method of claim 5, wherein the step of annealing to form the second metal silicide regions includes exposing the first metal silicide regions to a temperature between about 600° C. and about 850° C.

7. The method of claim 1, wherein only a portion of the deposited Si reacts with the first metal silicide regions to form the second metal silicide regions, with the remaining Si forming an unreacted Si portion, and further comprising stripping the unreacted Si portion after the annealing to form the second metal silicide regions.

8. The method of claim 1, wherein the first metal silicide is CoSi.

9. The method of claim 1, wherein the second metal silicide is $CoSi_2$.

10. A method of reducing consumption of silicon (Si) in source/drain junctions during silicidation, comprising the steps of:

forming first metal silicide regions on source/drain junctions having upper surfaces;

depositing Si on the first metal silicide regions; and transforming the first metal silicide regions into second metal silicide regions at a lower resistivity than said first metal silicide regions by consuming at least some of the deposited Si by diffusion reaction of a higher resistivity first metal silicide regions and the Si, wherein the second metal silicide regions extend below the upper surfaces of the source/drain junctions.

11. The method of claim 10, wherein the step of transforming includes heating the first metal silicide regions to a temperature between about 600° C. and about 850° C.

12. The method of claim 11, wherein the Si is deposited to a thickness of between about 50–1000Å.

13. The method of claim 12, wherein the step of forming the first metal suicide regions includes depositing metal on the source/drain junctions and heating the source/drain junctions to a temperature between about 450° C. and about 600° C.

14. The method of claim 12, wherein the Si is deposited by physical vapor deposition (PVD) sputtering.

15. The method of claim 12, wherein the Si is deposited by low temperature chemical vapor deposition.

16. The method of claim 10, further comprising removing Si that was not consumed during the transforming of the first metal silicide regions into the second metal silicide regions.

17. The method of claim 10, wherein the first metal silicide is CoSi.

18. The method of claim 10, wherein the second metal silicide is $CoSi_2$.

* * * * *